United States Patent
Shan

(10) Patent No.: US 12,230,584 B2
(45) Date of Patent: Feb. 18, 2025

(54) METHOD FOR MANUFACTURING SEMICONDUCTOR MARK, AND SEMICONDUCTOR MARK

(71) Applicant: CHANGXIN MEMORY TECHNOLOGIES, INC., Hefei (CN)

(72) Inventor: Chuang Shan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 527 days.

(21) Appl. No.: 17/648,878

(22) Filed: Jan. 25, 2022

(65) Prior Publication Data
US 2022/0216163 A1 Jul. 7, 2022

Related U.S. Application Data

(63) Continuation of application No. PCT/CN2021/106577, filed on Jul. 15, 2021.

(30) Foreign Application Priority Data

Jan. 7, 2021 (CN) .......................... 202110016542.8

(51) Int. Cl.
*H01L 23/544* (2006.01)
*G03F 1/36* (2012.01)

(52) U.S. Cl.
CPC .............. *H01L 23/544* (2013.01); *G03F 1/36* (2013.01); *H01L 2223/54426* (2013.01)

(58) Field of Classification Search
CPC ......... H01L 23/544; H01L 2223/54426; G03F 1/36; G03F 9/7076; G03F 9/708
See application file for complete search history.

(56) References Cited

U.S. PATENT DOCUMENTS

| | | | |
|---|---|---|---|
| 9,147,035 B1* | 9/2015 | Huang | G06F 30/398 |
| 10,957,744 B2 | 3/2021 | Kong et al. | |
| 11,188,703 B2* | 11/2021 | Huang | G06F 30/394 |
| 2009/0298205 A1* | 12/2009 | Nagahara | G03F 1/70 |
| | | | 257/E21.53 |
| 2013/0198699 A1* | 8/2013 | Simmons | G03F 1/36 |
| | | | 716/53 |
| 2015/0125063 A1* | 5/2015 | Hsieh | G06T 7/001 |
| | | | 382/149 |
| 2015/0227666 A1* | 8/2015 | Seo | G03F 1/36 |
| | | | 716/55 |
| 2016/0210395 A1* | 7/2016 | Su | G06F 30/392 |
| 2018/0341736 A1* | 11/2018 | Chen | G03F 1/36 |
| 2019/0065654 A1* | 2/2019 | Liao | G06F 30/367 |
| 2019/0131359 A1 | 5/2019 | Kong et al. | |

(Continued)

FOREIGN PATENT DOCUMENTS

| | | |
|---|---|---|
| CN | 101320206 A | 12/2008 |
| CN | 102063010 A | 5/2011 |

(Continued)

*Primary Examiner* — Nha T Nguyen
(74) *Attorney, Agent, or Firm* — Syncoda LLC; Feng Ma

(57) ABSTRACT

A method for manufacturing semiconductor mark includes: providing a pattern having a peripheral edge corrected by Optical Proximity Correction (OPC); cutting multiple independent alignment sections from the pattern; and splicing the multiple alignment sections to form a semiconductor mark having a peripheral edge corrected by OPC.

20 Claims, 15 Drawing Sheets

```
┌─────────────────────────────────────┐
│ A pattern having a peripheral edge  │
│ corrected by OPC is provided        │──── S101
└─────────────────┬───────────────────┘
                  ▼
┌─────────────────────────────────────┐
│ Multiple independent alignment      │
│ sections are cut from the pattern   │──── S103
└─────────────────┬───────────────────┘
                  ▼
┌─────────────────────────────────────┐
│ The multiple alignment sections are │
│ spliced to form a semiconductor     │
│ mark having a peripheral edge       │──── S105
│ corrected by OPC                    │
└─────────────────────────────────────┘
```

(56) References Cited

U.S. PATENT DOCUMENTS

| | | | |
|---|---|---|---|
| 2019/0187552 A1* | 6/2019 | Choi | G03F 7/70508 |
| 2020/0064728 A1* | 2/2020 | Misaka | G03F 7/2004 |
| 2020/0081352 A1* | 3/2020 | Kim | G03F 1/36 |
| 2022/0299884 A1* | 9/2022 | Trivedi | G03F 1/36 |

FOREIGN PATENT DOCUMENTS

| | | |
|---|---|---|
| CN | 103365071 A | 10/2013 |
| CN | 111458974 A | 7/2020 |
| CN | 112864023 A | 5/2021 |
| TW | 420834 B | 2/2001 |

* cited by examiner (a)

(b)

(c)

(a)

(b)

(c)

(a)

(b)

(c)

(a)

(b)

(c)

METHOD FOR MANUFACTURING SEMICONDUCTOR MARK, AND SEMICONDUCTOR MARK

CROSS-REFERENCE TO RELATED APPLICATIONS

This is a continuation of International Patent Application No. PCT/CN2021/106577 filed on Jul. 15, 2021, which claims priority to Chinese patent application No. 202110016542.8 filed on Jan. 7, 2021. The disclosures of the above-referenced applications are hereby incorporated by reference in their entirety.

BACKGROUND

In a semiconductor manufacturing process, especially a Dynamic Random Access Memory (DRAM) manufacturing process, semiconductor marks need to be used to assist in the alignment of a semiconductor structure with a machine, etc.

SUMMARY

The disclosure relates to the technical field of semiconductors, and in particular to a method for manufacturing semiconductor mark and a semiconductor mark.

The disclosure provides a method for manufacturing semiconductor mark and a semiconductor mark, to improve the manufacturing efficiency of the semiconductor mark.

According to a first aspect of the disclosure, a method for manufacturing semiconductor mark is provided. The method includes the following operations.

A pattern having a peripheral edge corrected by Optical Proximity Correction (OPC) is provided.

Multiple independent alignment sections are cut from the pattern.

The multiple alignment sections are spliced to form a semiconductor mark having a peripheral edge corrected by OPC.

According to a second aspect of the disclosure, a semiconductor mark is provided, and the semiconductor mark is implemented according to the above method for manufacturing semiconductor mark.

BRIEF DESCRIPTION OF THE DRAWINGS

Various objects, features, and advantages of the disclosure will become more apparent from the following detailed description of preferred implementations of the disclosure when considered in conjunction with the accompanying drawings. The drawings are merely exemplary illustrations of the disclosure and are not necessarily drawn to scale. In the drawings, like reference numerals refer to the same or similar components throughout.

Figure 1:
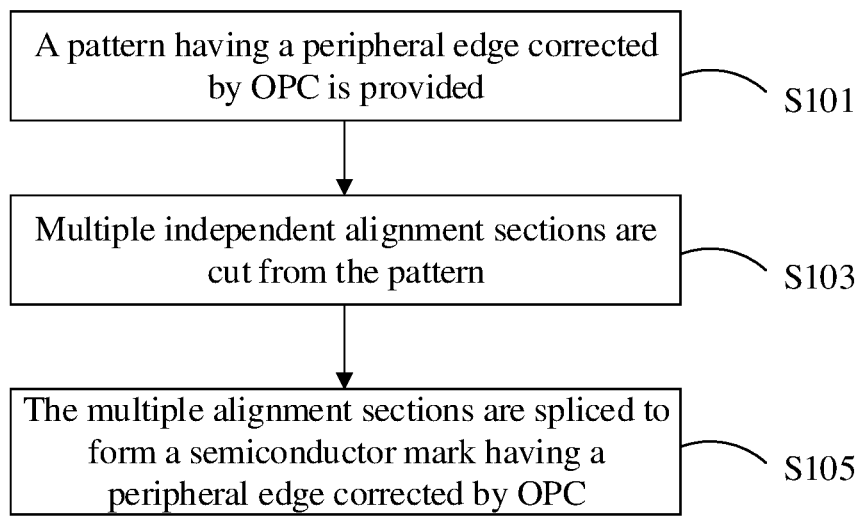
FIG. 1 is a schematic flowchart of a method for manufacturing semiconductor mark according to an exemplary embodiment.

Reference numerals are illustrated as follows.

10: pattern; 11: original edge; 12: cutting edge; 13: first alignment section; 14: second alignment section; 20: first semiconductor mark;

21: first section; 22: second section; 23: third section; 30: second semiconductor mark;

24: first section; 25: second section; 1: first fill region; 40, third semiconductor mark;

131: first alignment section; 141: second alignment section; 2: second fill region; 50: fourth semiconductor mark;

16: first alignment section; 17: second alignment section; 18: third alignment section; 19: fourth alignment section; 60: fifth semiconductor mark;

161: first alignment section; 171: second alignment section; 181: third alignment section; 191: fourth alignment section; 3: third fill region; 70: sixth semiconductor mark;

101: first alignment section; 102: second alignment section; 103: third alignment section; 80: seventh semiconductor mark.

DETAILED DESCRIPTION

Exemplary embodiments that embody the features and advantages of the disclosure will be described in detail in the following description. It will be appreciated that the disclosure may have various changes in different embodiments without departing from the scope of the disclosure, and that the description and drawings are illustrative in nature and are not intended to limit the disclosure.

In the following description of various exemplary embodiments of the disclosure, reference is made to the accompanying drawings, which form a part thereof, and in which various exemplary structures, systems, and steps capable of implementing various aspects of the disclosure are shown by way of illustration. It will be appreciated that other specific solutions of components, structures, exemplary devices, systems, and steps may be utilized and structural and functional modifications may be made without departing from the scope of the disclosure. Moreover, although the terms "on", "between", "in", etc. may be used in this specification to describe different exemplary features and elements of the disclosure, these terms are used herein for convenience only, e.g., in accordance with the orientation of the examples in the figures. Nothing in this specification should be construed as requiring a particular three-dimensional orientation of the structure in order to fall within the scope of the disclosure.

In the related art, there is no uniform mode for manufacturing semiconductor marks, and the overall manufacturing efficiency is low.

An embodiment of the disclosure provides a method for manufacturing semiconductor mark. Referring to FIG. 1, the method for manufacturing semiconductor mark includes the following operations.

At S101, a pattern 10 having a peripheral edge corrected by Optical Proximity

Correction (OPC) is provided.

At S103, multiple independent alignment sections are cut from the pattern 10.

At S105, the multiple alignment sections are spliced to form a semiconductor mark having a peripheral edge corrected by OPC.

In the method for manufacturing semiconductor mark according to an embodiment of the disclosure, a semiconductor mark having a peripheral edge corrected by OPC is obtained by cutting and splicing patterns 10 having a peripheral edge corrected by OPC. That is, the semiconductor mark having the peripheral edge corrected by OPC may be formed after multiple alignment sections are spliced, thereby saving time for OPC after the semiconductor mark is formed, and improving the manufacturing efficiency of the semiconductor mark.

It should be noted that an OPC technology is to compensate a distortion and offset of a pattern by changing the pattern systematically so that a final exposure pattern on a wafer substrate can meet design requirements of a circuit pattern. In the embodiment, the pattern 10 corrected by OPC is selected for cutting, and at least part of alignment sections obtained by cutting have been corrected by OPC. Therefore, it is possible to form a semiconductor mark having a peripheral edge corrected by OPC after the multiple alignment sections are spliced.

In an embodiment, the alignment section includes an original edge 11 corrected by OPC and a cutting edge 12 not corrected by OPC. The respective cutting edges 12 of the multiple alignment sections are spliced to form the semiconductor mark.

That is, alignment sections to be spliced are spliced according to the cutting edges 12, and the original edges 11 corrected by OPC define the peripheral edge of the semiconductor mark. Therefore, the finally formed semiconductor mark is a semiconductor mark having the peripheral edge corrected by OPC.

In an embodiment, the multiple alignment sections include a first alignment section 13 and a second alignment section 14. The first alignment section 13 includes a cutting edge 12. The second alignment section 14 includes a cutting edge 12. The first alignment section 13 and the second alignment section 14 are butted to form a first semiconductor mark 20. The first alignment section 13 and the second alignment section 14 are obtained by cutting two opposite sides of the pattern 10. That is, two corners corresponding to the obtained first alignment section 13 and second alignment section 14 are corrected by OPC.

In an embodiment, the first alignment section 13 and the second alignment section 14 may be formed by cutting two opposite corners of the pattern 10. That is, the operation of cutting two opposite sides of the pattern 10 includes cutting upper and lower sides, left and right sides, or two opposite corners of the pattern 10.

Figure 2:
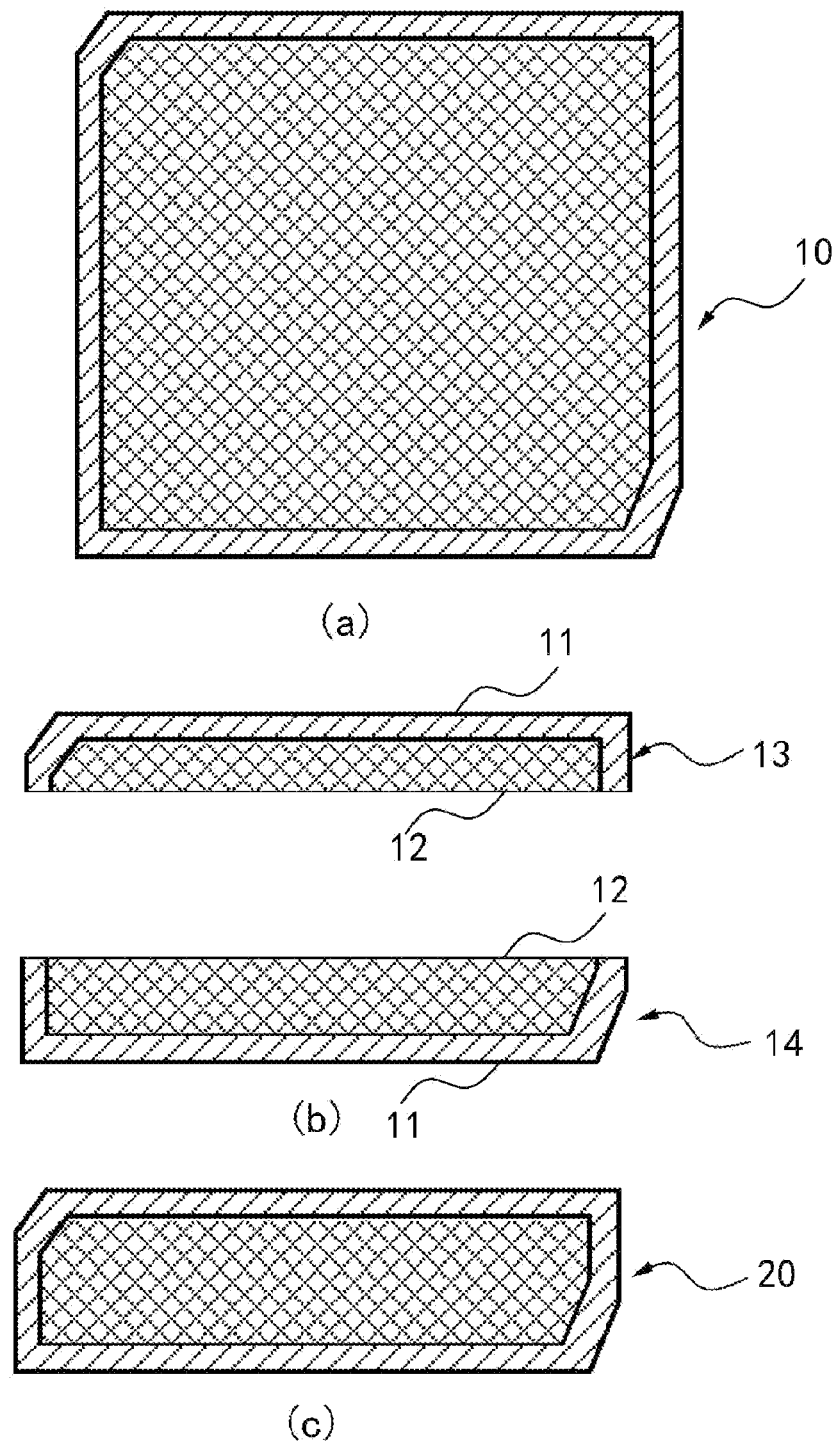
FIG. 2 is a schematic structural diagram of a method for manufacturing semiconductor mark according to a first exemplary embodiment.

In some embodiments, as shown in FIG. 2, the method for manufacturing semiconductor mark includes the following operations.

As shown in (a) of FIG. 2, a pattern 10 having a peripheral edge corrected by OPC is provided.

As shown in (b) of FIG. 2, upper and lower sides of the pattern 10 are cut to obtain a first alignment section 13 and a second alignment section 14.

As shown in (c) of FIG. 2, a cutting edge 12 of the first alignment section 13 and a cutting edge 12 of the second alignment section 14 are butted to form a first semiconductor mark 20.

Figure 5:
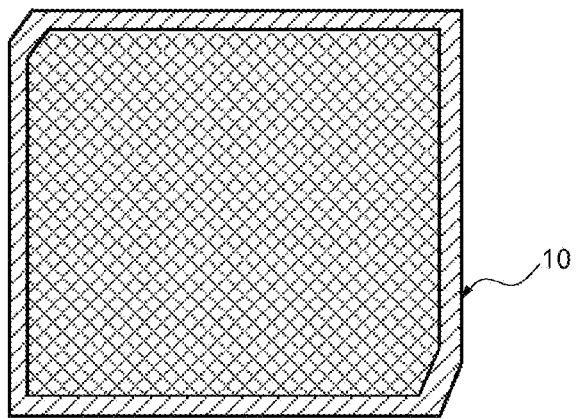
FIG. 5 is a schematic structural diagram of a method for manufacturing semiconductor mark according to a fourth exemplary embodiment.
Figure 5:
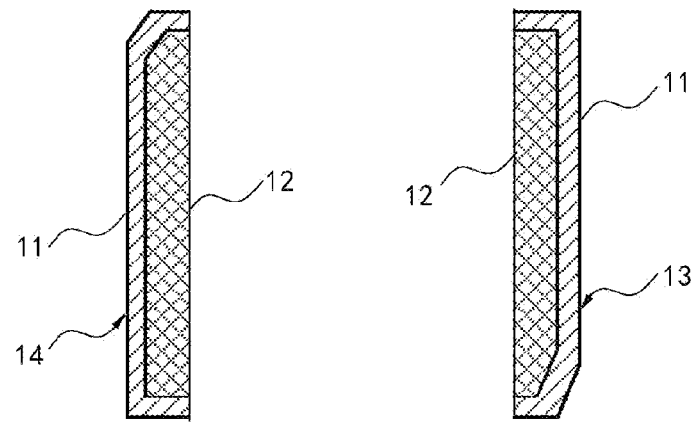
Figure 5:
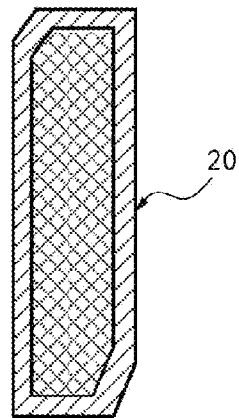

In some embodiments, as shown in FIG. 5, the method for manufacturing semiconductor mark includes the following operations.

As shown in (a) of FIG. 5, a pattern 10 having a peripheral edge corrected by OPC is provided.

As shown in (b) of FIG. 5, left and right sides of the pattern 10 are cut to obtain a first alignment section 13 and a second alignment section 14.

As shown in (c) of FIG. 5, a cutting edge 12 of the first alignment section 13 and a cutting edge 12 of the second alignment section 14 are butted to form a first semiconductor mark 20.

In some embodiments, after obtaining the first alignment section 13 and the second alignment section 14 shown in (b) of FIG. 2 or FIG. 5, intermediate sections of the first alignment section 13 and the second alignment section 14 may be cut off and spliced, i.e., the first alignment section 13 and the second alignment section 14 are cut, so that a semiconductor mark obtained after splicing is shorter than the first semiconductor mark 20.

In an embodiment, after forming the first semiconductor mark 20, the method for manufacturing semiconductor mark further includes the following operations. The first semiconductor mark 20 is sequentially cut into a first section 21, a second section 22, and a third section 23. The first section 21 and the third section 23 are butted to form a second semiconductor mark 30. That is, an intermediate portion of the first semiconductor mark 20 is removed to obtain a second semiconductor mark 30 shorter than the first semiconductor mark 20.

Figure 3:
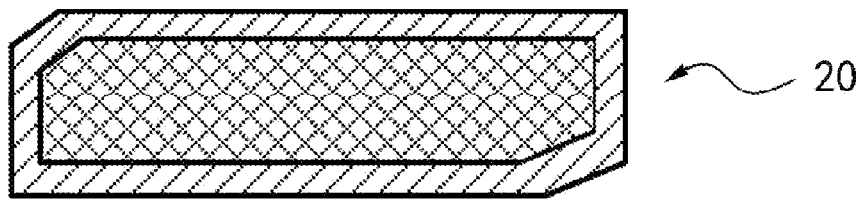
FIG. 3 is a schematic structural diagram of a method for manufacturing semiconductor mark according to a second exemplary embodiment.
Figure 3:
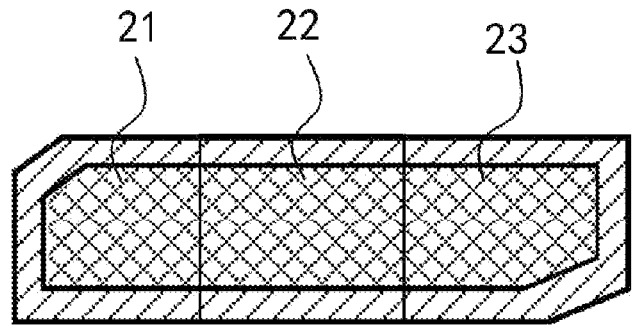
Figure 3:
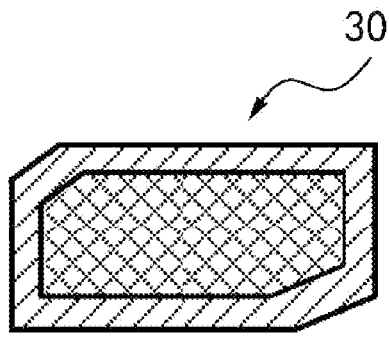

In some embodiments, as shown in FIG. 3, the method for manufacturing semiconductor mark includes the following operations.

As shown in (a) of FIG. 3, a first semiconductor mark 20 having a peripheral edge corrected by OPC is formed.

As shown in (b) of FIG. 3, the first semiconductor mark 20 is cut into three sections to obtain a first section 21, a second section 22, and a third section 23.

As shown in (c) of FIG. 3, a cutting edge 12 of the first section 21 and a cutting edge 12 of the third section 23 are butted to form a second semiconductor mark 30, i.e. the second section 22 is removed.

Figure 6:
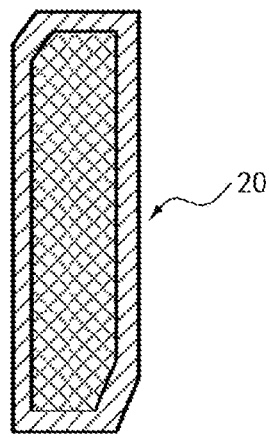
FIG. 6 is a schematic structural diagram of a method for manufacturing semiconductor mark according to a fifth exemplary embodiment.
Figure 6:
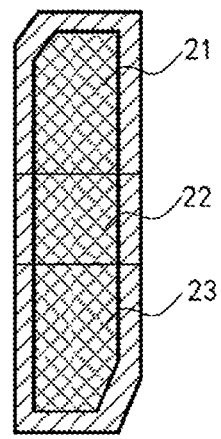
Figure 6:
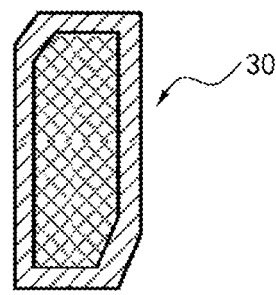

In some embodiments, as shown in FIG. 6, the method for manufacturing semiconductor mark includes the following operations.

As shown in (a) of FIG. 6, a first semiconductor mark 20 having a peripheral edge corrected by OPC is formed.

As shown in (b) of FIG. 6, the first semiconductor mark 20 is cut into three sections to obtain a first section 21, a second section 22, and a third section 23.

As shown in (c) of FIG. 6, a cutting edge 12 of the first section 21 and a cutting edge 12 of the third section 23 are butted to form a second semiconductor mark 30, i.e. the second section 22 is removed.

It should be noted that the first semiconductor mark 20 in FIG. 3 is obtained by the method for manufacturing semiconductor mark shown in FIG. 2, while the first semiconductor mark 20 in FIG. 6 is obtained by the method for manufacturing semiconductor mark shown in FIG. 5.

In an embodiment, after forming the first semiconductor mark 20, the method for manufacturing semiconductor mark further includes the following operations. The first semiconductor mark 20 is cut into a first section 24 and a second section 25. The first section 24 and the second section 25 are spaced apart and opposite to each other to form a first fill region 1. A first compensation pattern section is filled in the first fill region 1 to form a third semiconductor mark 40. The first compensation pattern section is corrected by OPC before filling, or the first compensation pattern section is corrected by OPC after filling. That is, a lengthening process is performed by cutting the first semiconductor mark 20 from the middle, thereby obtaining a third semiconductor mark 40 longer than the first semiconductor mark 20.

It should be noted that the first compensation pattern section is supplemented between the first section 24 and the second section 25. Therefore, only a straight side instead of corners is corrected when OPC is performed thereon, the entire correction is less difficult, and the correction efficiency is relatively high.

Figure 4:
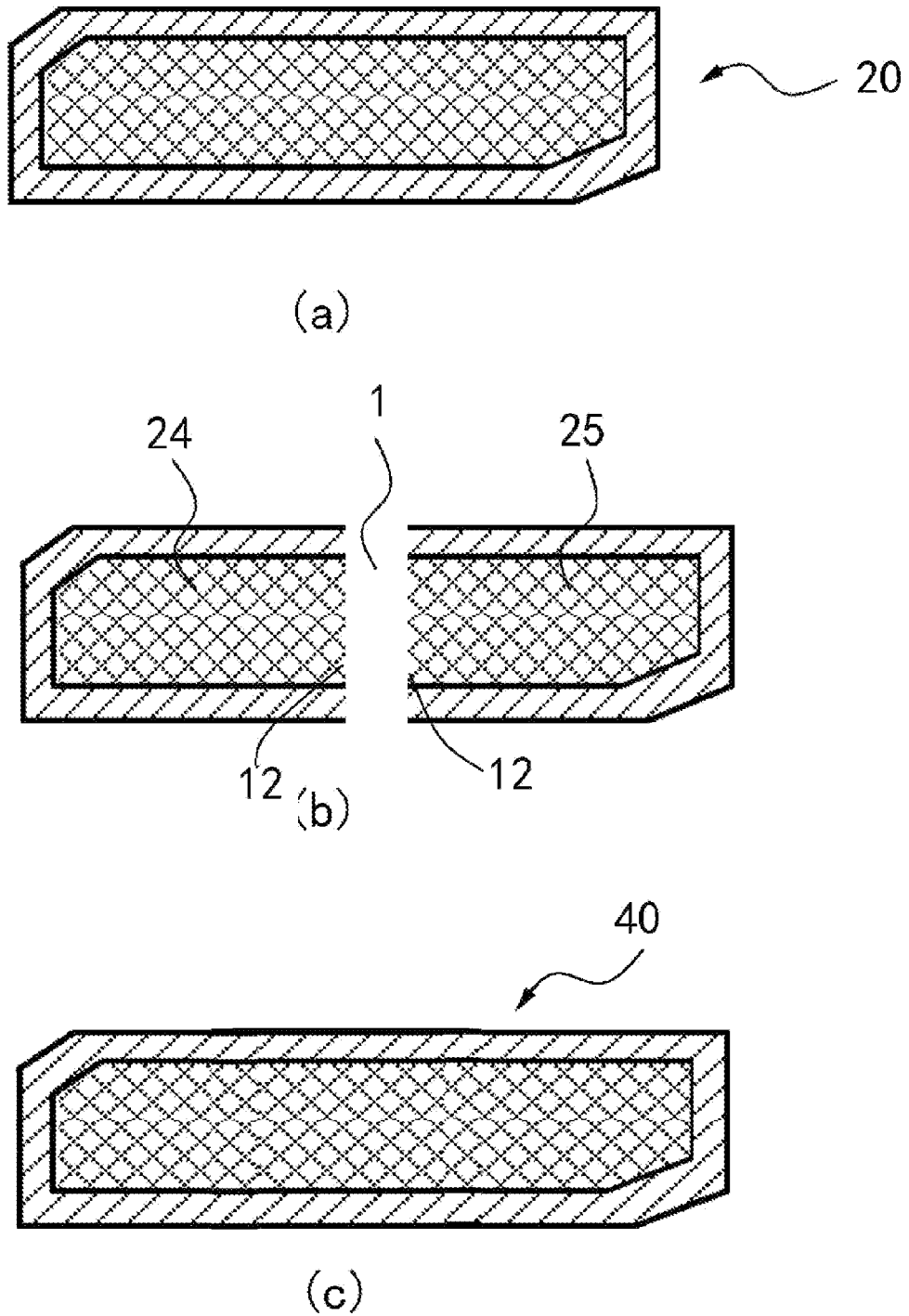
FIG. 4 is a schematic structural diagram of a method for manufacturing semiconductor mark according to a third exemplary embodiment.

In some embodiments, as shown in FIG. 4, the method for manufacturing semiconductor mark includes the following operations.

As shown in (a) of FIG. 4, a first semiconductor mark 20 having a peripheral edge corrected by OPC is formed.

As shown in (b) of FIG. 4, the first semiconductor mark 20 is cut into two sections to obtain a first section 24 and a second section 25, and a first fill region 1 is formed between a cutting edge 12 of the first section 24 and a cutting edge 12 of the second section 25 after they are pulled apart.

As shown in (c) of FIG. 4, a first compensation pattern section is filled into the first fill region 1 to obtain a third semiconductor mark 40.

Figure 7:
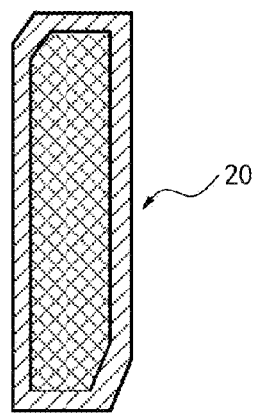
FIG. 7 is a schematic structural diagram of a method for manufacturing semiconductor mark according to a sixth exemplary embodiment.
Figure 7:
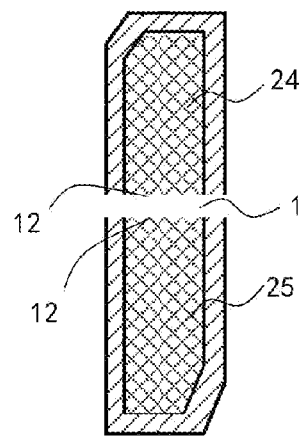
Figure 7:
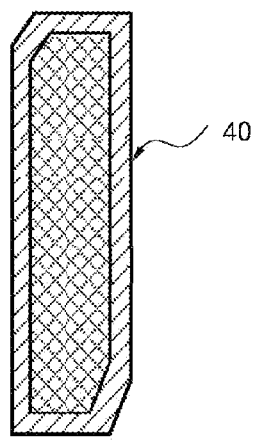

In some embodiments, as shown in FIG. 7, the method for manufacturing semiconductor mark includes the following operations.

As shown in (a) of FIG. 7, a first semiconductor mark 20 having a peripheral edge corrected by OPC is formed.

As shown in (b) of FIG. 7, the first semiconductor mark 20 is cut into two sections to obtain a first section 24 and a second section 25, and a first fill region 1 is formed between a cutting edge 12 of the first section 24 and a cutting edge 12 of the second section 25 after they are pulled apart.

As shown in (c) of FIG. 7, a first compensation pattern section is filled into the first fill region 1 to obtain a third semiconductor mark 40.

It should be noted that the first semiconductor mark 20 in FIG. 4 is obtained by the method for manufacturing semiconductor mark shown in FIG. 2, while the first semiconductor mark 20 in FIG. 7 is obtained by the method for manufacturing semiconductor mark shown in FIG. 5.

In an embodiment, the multiple independent alignment sections include a first alignment section 131 and a second alignment section 141. The first alignment section 131 includes a cutting edge 12. The second alignment section 141 includes a cutting edge 12. The first alignment section 131 and the second alignment section 141 are spaced apart and opposite to each other to form a second fill region 2. A second compensation pattern section is filled into the second fill region 2 to form a fourth semiconductor mark 50. The pattern 10 is cut from the middle to obtain the first alignment section 131 and the second alignment section 141. The second compensation pattern section is corrected by OPC before filling, or the second compensation pattern section is corrected by OPC after filling. That is, the lengthening process is performed by cutting the pattern 10 from the middle, thereby obtaining a fourth semiconductor mark 50 longer than the pattern 10.

Figure 8:
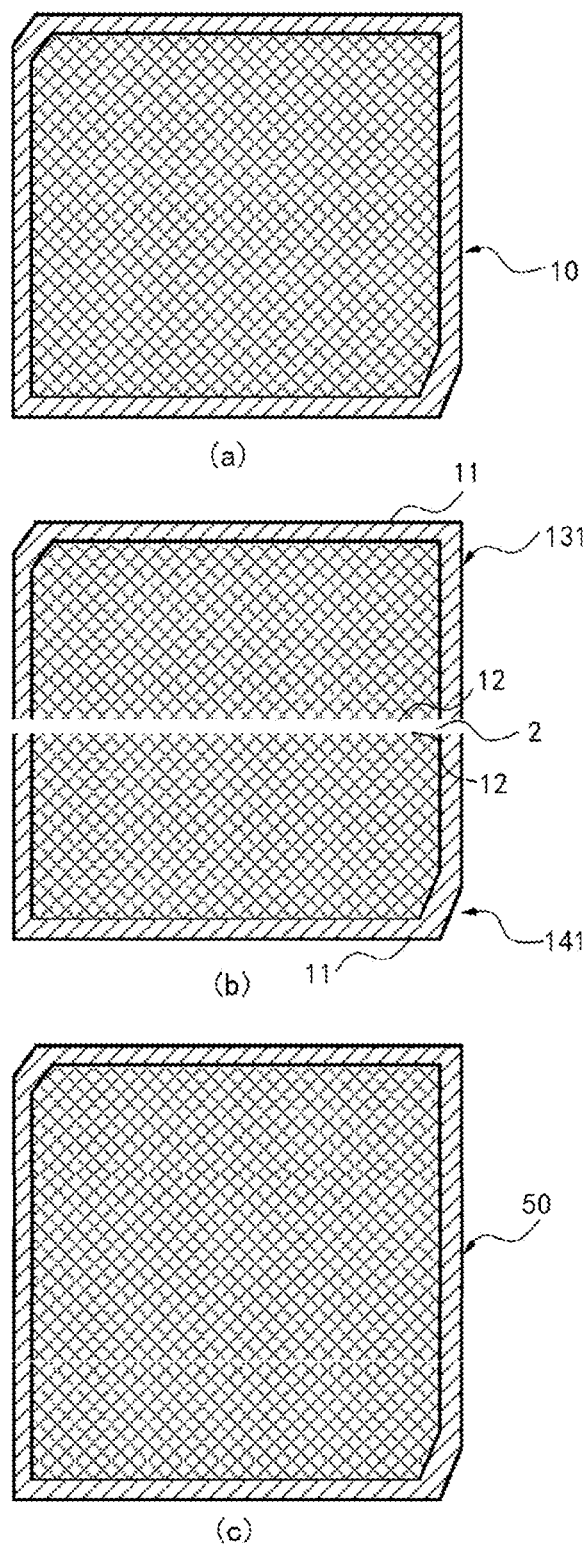
FIG. 8 is a schematic structural diagram of a method for manufacturing semiconductor mark according to a seventh exemplary embodiment.

In some embodiments, as shown in FIG. 8, the method for manufacturing semiconductor mark includes the following operations.

As shown in (a) of FIG. 8, a pattern 10 having a peripheral edge corrected by OPC is provided.

As shown in (b) of FIG. 8, the pattern 10 is cut into two sections to obtain a first alignment section 131 and a second alignment section 141, and a second fill region 2 is formed between a cutting edge 12 of the first alignment section 131 and a cutting edge 12 of the second alignment section 141 after they are pulled apart.

As shown in (c) of FIG. 8, a second compensation pattern section is filled into the second fill region 2 to obtain a fourth semiconductor mark 50.

In some embodiments, on the basis of FIG. 8, the pattern 10 may be cut into left and right sections and then a semiconductor mark may be obtained according to the above manufacturing method.

In an embodiment, the multiple independent alignment sections include a first alignment section 16, a second alignment section 17, a third alignment section 18, and a fourth alignment section 19. The first alignment section 16 includes two cutting edges 12. The second alignment section 17 includes two cutting edges 12. The third alignment section 18 includes two cutting edges 12. The fourth alignment section 19 includes two cutting edges 12. The first alignment section 16, the second alignment section 17, the third alignment section 18, and the fourth alignment section 19 are butted to form a fifth semiconductor mark 60. An area of the fifth semiconductor mark 60 is smaller than that of the pattern 10.

In an embodiment, the first alignment section 16, the second alignment section 17, the third alignment section 18, and the fourth alignment section 19 are obtained by cutting four corners of the pattern 10. That is, a middle portion of the pattern 10 is removed to obtain a relatively small fifth semiconductor mark 60 by splicing four diagonal sections of the pattern 10.

Figure 9:
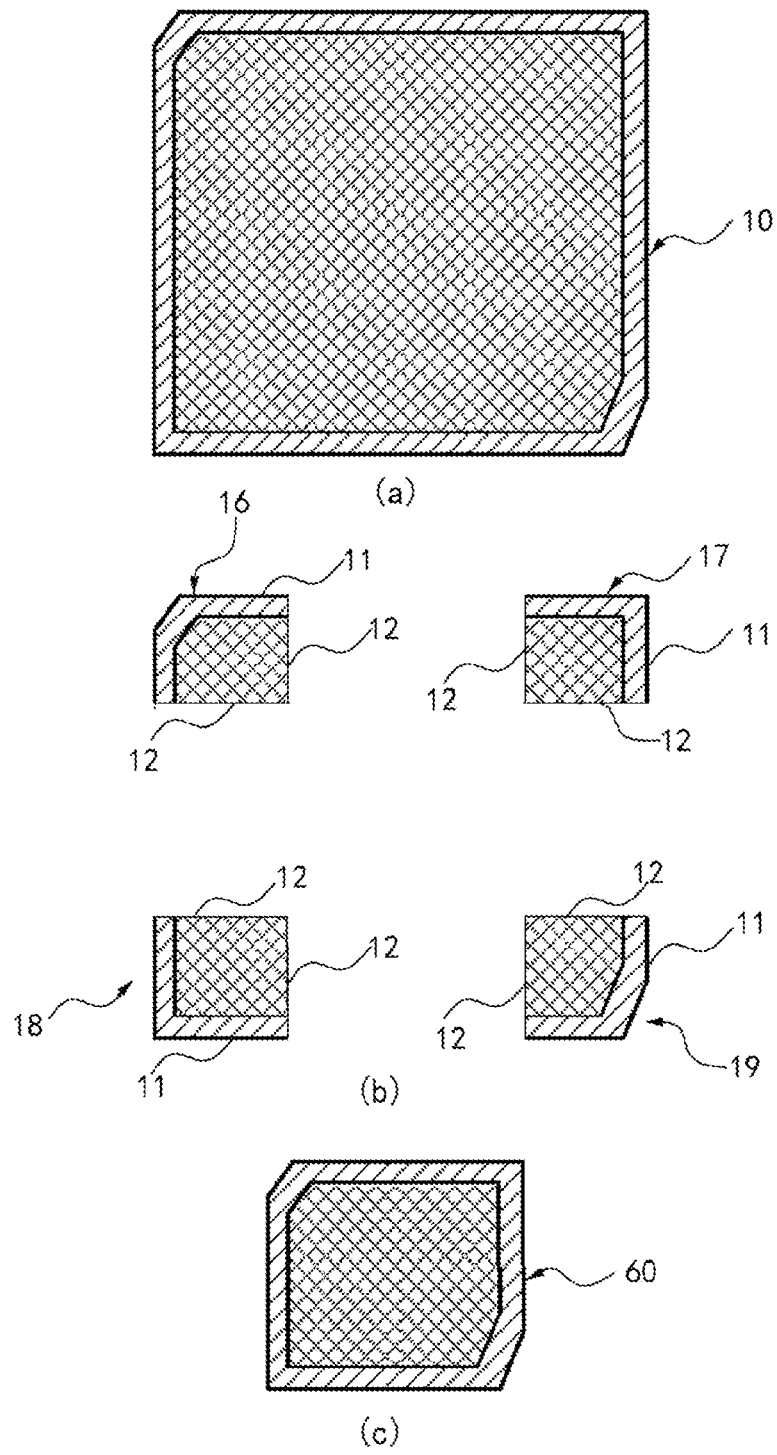
FIG. 9 is a schematic structural diagram of a method for manufacturing semiconductor mark according to an eighth exemplary embodiment.

In some embodiments, as shown in FIG. 9, the method for manufacturing semiconductor mark includes the following operations.

As shown in (a) of FIG. 9, a pattern 10 having a peripheral edge corrected by OPC is provided.

As shown in (b) of FIG. 9, four corner sections of the pattern 10 are cut to obtain a first alignment section 16, a second alignment section 17, a third alignment section 18, and a fourth alignment section 19.

As shown in (c) of FIG. 9, a cutting edge 12 of the first alignment section 16 and a cutting edge 12 of the second alignment section 17 are butted, another cutting edge 12 of the first alignment section 16 and a cutting edge 12 of the third alignment section 18 are butted, another cutting edge 12 of the second alignment section 17 and a cutting edge 12 of the fourth alignment section 19 are butted, and another cutting edge 12 of the third alignment section 18 and another cutting edge 12 of the fourth alignment section 19 are butted, to form a fifth semiconductor mark 60.

In an example, the pattern 10 is cut into four portions in two perpendicular directions, which are then secondarily cut to obtain the first alignment section 16, the second alignment section 17, the third alignment section 18, and the fourth alignment section 19, respectively. That is, the pattern 10 is first cut into four portions, and then the cut four portions are cut down to obtain the relatively small first alignment section 16, second alignment section 17, third alignment section 18, and fourth alignment section 19.

Figure 10:
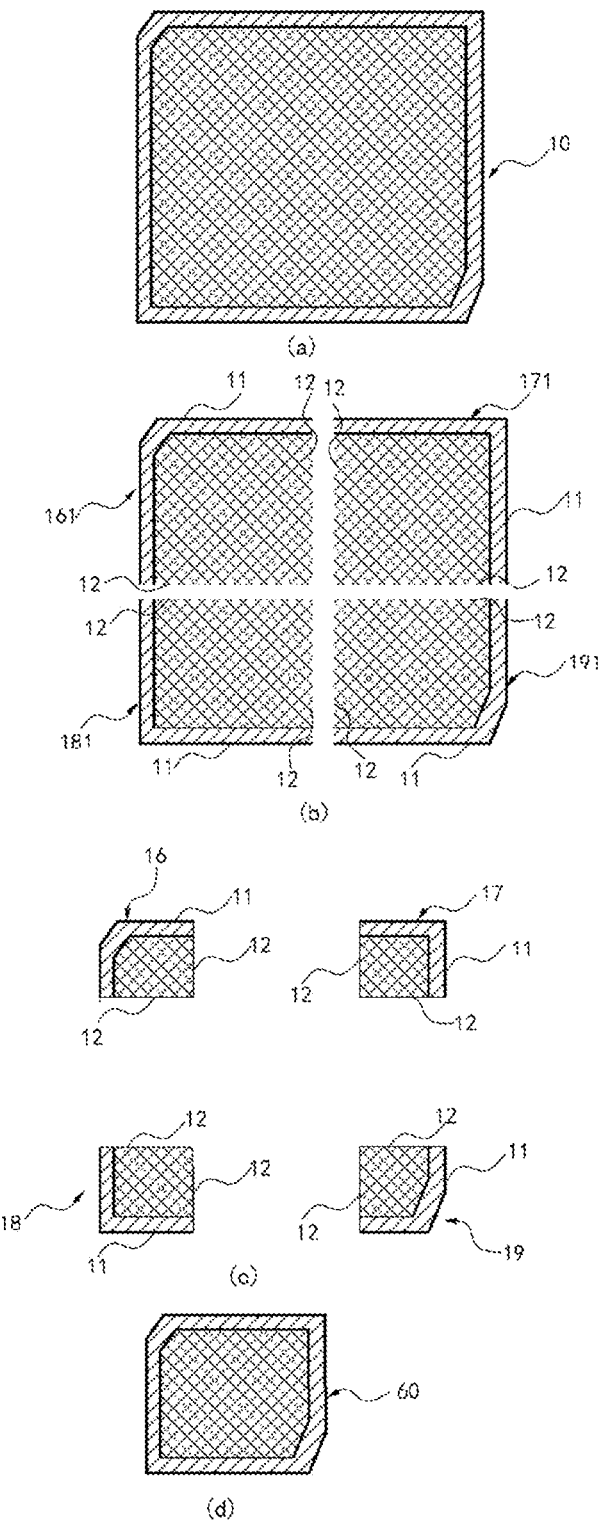
FIG. 10 is a schematic structural diagram of a method for manufacturing semiconductor mark according to a ninth exemplary embodiment.

In some embodiments, as shown in FIG. 10, the method for manufacturing semiconductor mark includes the following operations.

As shown in (a) of FIG. 10, a pattern 10 having a peripheral edge corrected by OPC is provided.

As shown in (b) of FIG. 10, the pattern 10 is cut into four portions to obtain a first alignment section 161, a second alignment section 171, a third alignment section 181, and a fourth alignment section 191.

As shown in (c) of FIG. 10, the first alignment section 161, the second alignment section 171, the third alignment section 181, and the fourth alignment section 191 are cut respectively to obtain a first alignment section 16, a second alignment section 17, a third alignment section 18, and a fourth alignment section 19.

As shown in (d) of FIG. 10, a cutting edge 12 of the first alignment section 16 and a cutting edge 12 of the second alignment section 17 are butted, another cutting edge 12 of the first alignment section 16 and a cutting edge 12 of the third alignment section 18 are butted, another cutting edge 12 of the second alignment section 17 and a cutting edge 12 of the fourth alignment section 19 are butted, and another cutting edge 12 of the third alignment section 18 and another cutting edge 12 of the fourth alignment section 19 are butted, to form a fifth semiconductor mark 60.

In an embodiment, the multiple independent alignment sections include a first alignment section 161, a second alignment section 171, a third alignment section 181, and a fourth alignment section 191. The first alignment section 161 includes two cutting edges 12. The second alignment section 171 includes two cutting edges 12. The third alignment section 181 includes two cutting edges 12. The fourth alignment section 191 includes two cutting edges 12. The first alignment section 161, the second alignment section 171, the third alignment section 181, and the fourth alignment section 191 are spaced apart and opposite to each other to form a third fill region 3. A third compensation pattern section is filled into the third fill region 3 to form a sixth semiconductor mark 70. The pattern 10 is cut in two perpendicular directions to obtain the first alignment section 161, the second alignment section 171, the third alignment section 181, and the fourth alignment section 191. The third compensation pattern section is corrected by OPC before filling, or the third compensation pattern section is corrected by OPC after filling. That is, a sixth semiconductor mark 70 having a larger area is obtained by cutting the pattern 10 into four portions and filling the third compensation pattern therebetween.

Figure 11:
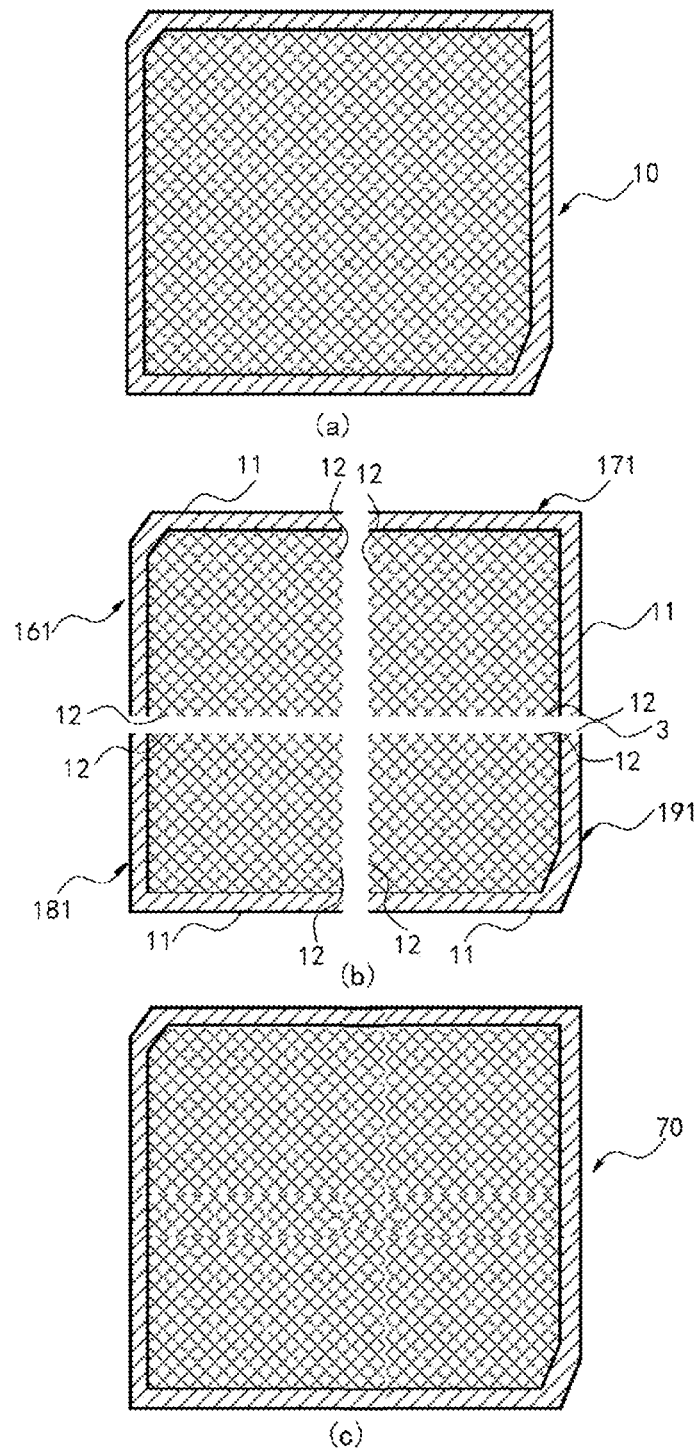
FIG. 11 is a schematic structural diagram of a method for manufacturing semiconductor mark according to a tenth exemplary embodiment.

In some embodiments, as shown in FIG. 11, the method for manufacturing semiconductor mark includes the following operations.

As shown in (a) of FIG. 11, a pattern 10 having a peripheral edge corrected by OPC is provided.

As shown in (b) of FIG. 11, the pattern 10 is cut into four portions to obtain a first alignment section 161, a second alignment section 171, a third alignment section 181, and a fourth alignment section 191. A cutting edge 12 of the first alignment section 161 and a cutting edge 12 of the second alignment section 171 are spaced apart and opposite to each other. Another cutting edge 12 of the first alignment section 161 and a cutting edge 12 of the third alignment section 181 are spaced apart and opposite to each other. Another cutting edge 12 of the second alignment section 171 and a cutting edge 12 of the fourth alignment section 191 are spaced apart and opposite to each other. Another cutting edge 12 of the third alignment section 181 and another cutting edge 12 of the fourth alignment section 191 are spaced apart and opposite to each other. That is, a third fill region 3 is formed among the first alignment section 161, the second alignment section 171, the third alignment section 181, and the fourth alignment section 191.

As shown in (c) of FIG. 11, a third compensation pattern section is filled into the third fill region 3 to obtain a sixth semiconductor mark 70.

It should be noted that the semiconductor marks obtained in FIGS. 2-11 may be Overlay (OVL) marks.

In an embodiment, the multiple independent alignment sections include a first alignment section 101, a second alignment section 102, and a third alignment section 103. The first alignment section 101 includes two cutting edges 12, and the first alignment section 101 is L-shaped. The second alignment section 102 includes two cutting edges 12, and the second alignment section 102 is straight. The third alignment section 103 includes two cutting edges 12, and the third alignment section 103 is straight. The second alignment section 102 and the first alignment section 101 are butted while the third alignment section 103 and the first alignment section 101 are butted to form a seventh semiconductor mark 80. That is, the first alignment section 101 forms an alignment standard by cutting out an L-shaped first alignment section 101 when butting the second alignment section 102 and the third alignment section 103, so that the butting efficiency can be improved.

In an embodiment, a length of the second alignment section 102 is equal to that of one cutting edge 12 of the first alignment section 101. A length of the third alignment section 103 is equal to that of the other cutting edge 12 of the first alignment section 101. That is, portions of the second alignment section 102 and the third alignment section 103 overlay after forming the seventh semiconductor mark 80.

Figure 12:
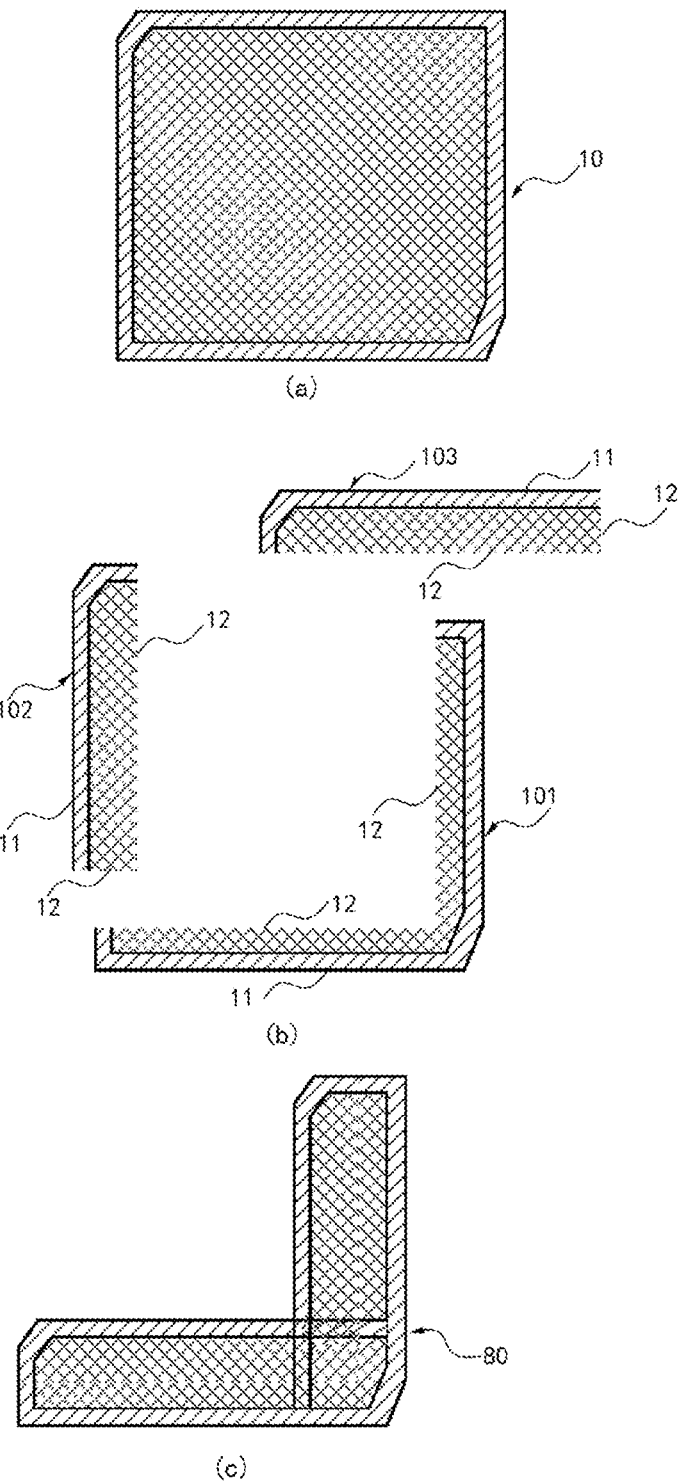
FIG. 12 is a schematic structural diagram of a method for manufacturing semiconductor mark according to an eleventh exemplary embodiment.

In some embodiments, as shown in FIG. 12, the method for manufacturing semiconductor mark includes the following operations.

As shown in (a) of FIG. 12, one or more patterns 10 having peripheral edges corrected by OPC are provided.

As shown in (b) of FIG. 12, a first alignment section 101, a second alignment section 102, and a third alignment section 103 are cut from the periphery of the one or more patterns 10.

As shown in (c) of FIG. 12, a cutting edge 12 of the first alignment section 101 and a cutting edge 12 of the second alignment section 102 are butted, and another cutting edge 12 of the first alignment section 101 and a cutting edge 12 of the third alignment section 103 are butted, to form a seventh semiconductor mark 80. The second alignment section 102 and the third alignment section 103 overlay at a corner of the first alignment section 101.

Figure 13:
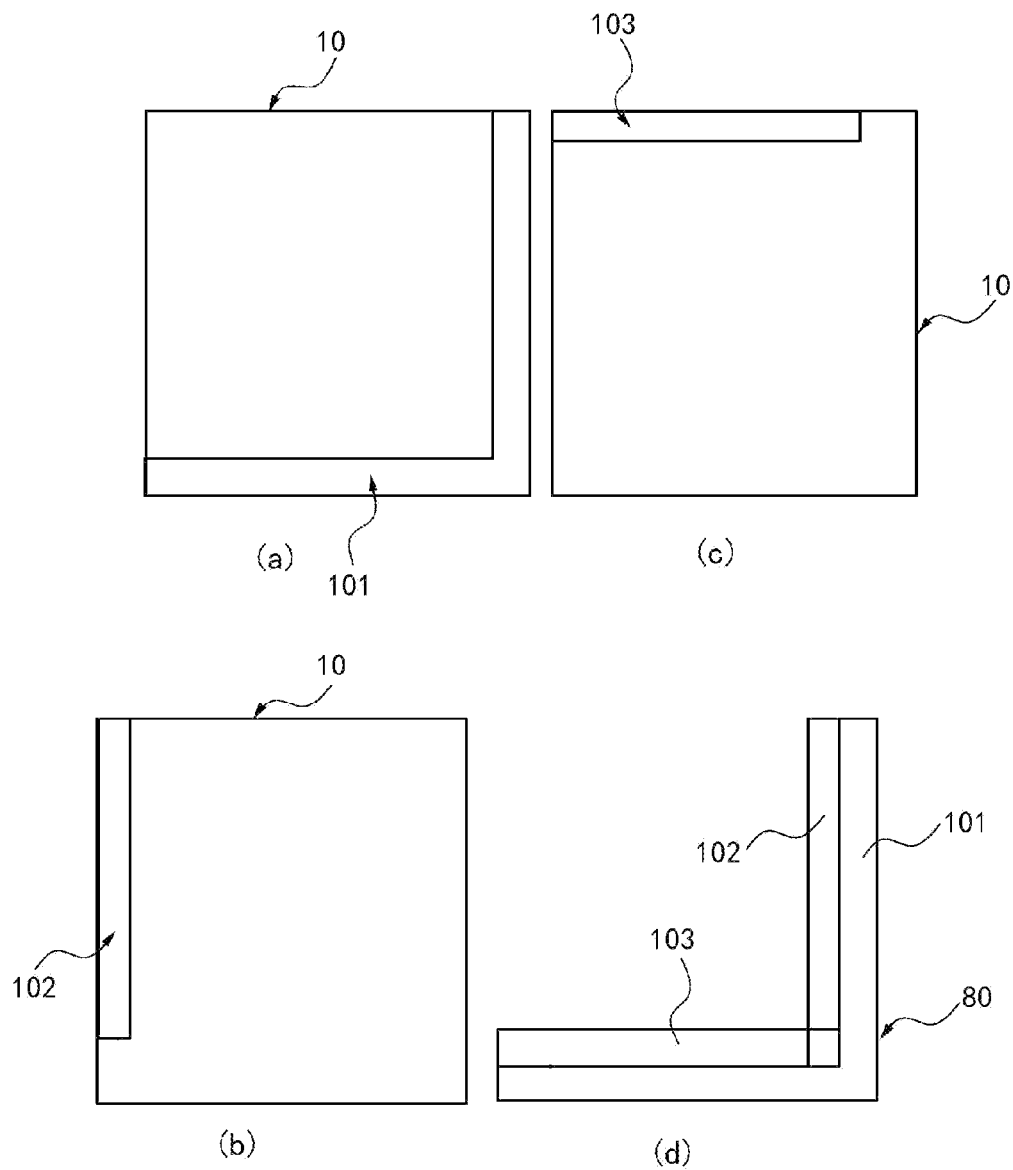
FIG. 13 is a simple schematic structural diagram showing the method for manufacturing semiconductor mark according to the eleventh exemplary embodiment.

As can be seen in conjunction with FIG. 13, as shown in (a) of FIG. 13, two side portions of the pattern 10 are cut out to form an L-shaped first alignment section 101. As shown in (b) of FIG. 13, a third side portion of the pattern 10 is cut out to form a straight second alignment section 102. As shown in (c) of FIG. 13, a fourth side portion of the pattern 10 is cut out to form a straight third alignment section 103. The length of the second alignment section 102 is equal to that of one cutting edge 12 of the first alignment section 101. The length of the third alignment section 103 is equal to that of the other cutting edge 12 of the first alignment section 101.

It should be noted that in the embodiment shown in FIG. 13, the first alignment section 101, the second alignment section 102, and the third alignment section 103 are obtained by cutting at least two patterns 10. In some embodiments, the first alignment section 101, the second alignment section 102, and the third alignment section 103 may be secondarily cut after they have been cut, i.e., the middle section may be removed, or may be cut from the middle and lengthened, which are not limited herein. It may be adjusted according to actual requirements.

In an embodiment, the length of the second alignment section 102 is equal to that of one cutting edge 12 of the first alignment section 101. The length of the third alignment section 103 is equal to the length of the other cutting edge 12 of the first alignment section 101 minus the width of the second alignment section 102. That is, after forming the seventh semiconductor mark 80, portions of the second alignment section 102 and the third alignment section 103 are just butted.

Figure 14:
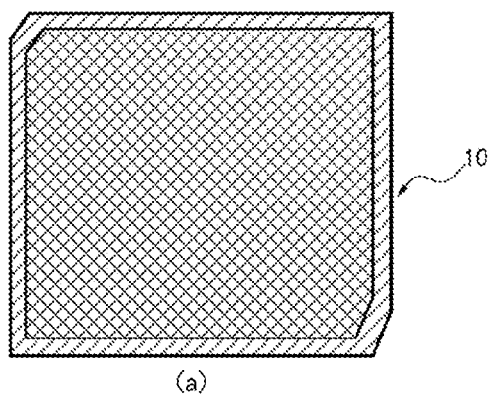
FIG. 14 is a schematic structural diagram of a method for manufacturing semiconductor mark according to a twelfth exemplary embodiment.
Figure 14:
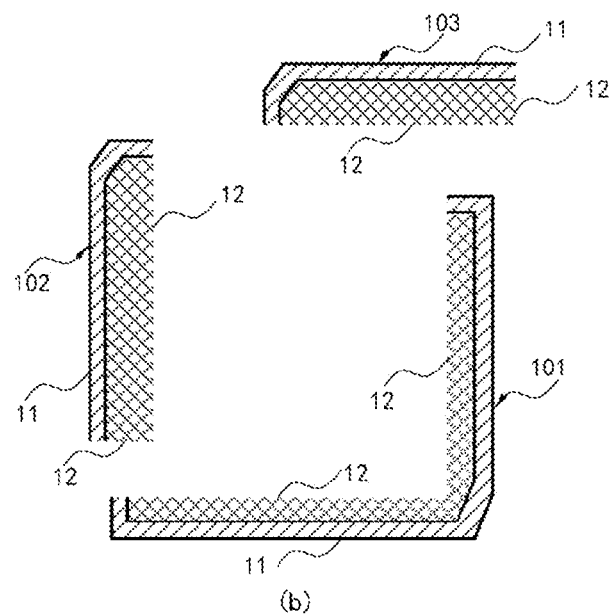
Figure 14:
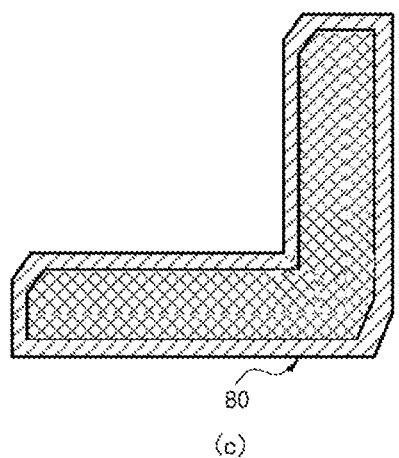

In some embodiments, as shown in FIG. 14, the method for manufacturing semiconductor mark includes the following operations.

As shown in (a) of FIG. 14, one or more patterns 10 having peripheral edges corrected by OPC are provided.

As shown in (b) of FIG. 14, a first alignment section 101, a second alignment section 102, and a third alignment section 103 are cut from the periphery of the one or more patterns 10.

As shown in (c) of FIG. 14, a cutting edge 12 of the first alignment section 101 and a cutting edge 12 of the second alignment section 102 are butted, and another cutting edge 12 of the first alignment section 101 and a cutting edge 12 of the third alignment section 103 are butted, to form a seventh semiconductor mark 80. The second alignment section 102 and the third alignment section 103 are just butted without overlay at the corner of the first alignment section 101.

Figure 15:
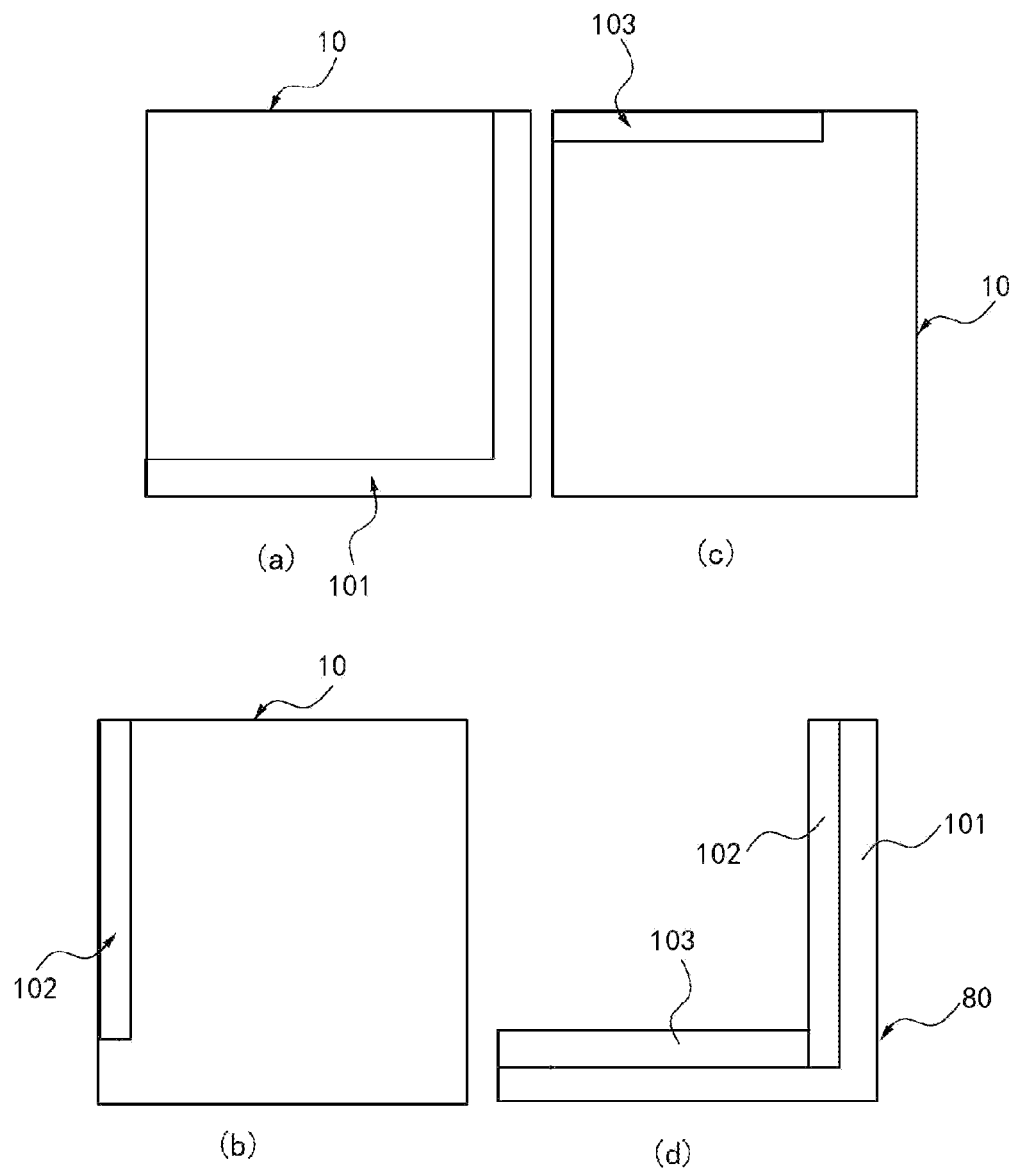
FIG. 15 is a simple schematic structural diagram showing the method for manufacturing semiconductor mark according to the twelfth exemplary embodiment.

As can be seen in conjunction with FIG. 15, as shown in (a) of FIG. 15, two side portions of the pattern 10 are cut out to form an L-shaped first alignment section 101. As shown in (b) of FIG. 15, a third side portion of the pattern 10 is cut out to form a straight second alignment section 102. As shown in (c) of FIG. 15, a fourth side portion of the pattern 10 is cut out to form a straight third alignment section 103. The length of the second alignment section 102 is equal to that of one cutting edge 12 of the first alignment section 101. The length of the third alignment section 103 is equal to the length of the other cutting edge 12 of the first alignment section 101 minus the width of the second alignment section 102.

It should be noted that in the embodiment shown in FIG. 15, the first alignment section 101, the second alignment section 102, and the third alignment section 103 are obtained by cutting at least two patterns 10. In some embodiments, the first alignment section 101, the second alignment section 102, and the third alignment section 103 may be secondarily cut after they have been cut, i.e., the middle section may be removed, or may be cut from the middle and lengthened, which are not limited herein. It may be adjusted according to actual requirements.

In an embodiment, the first alignment section 101 and the second alignment section 102 are cut from the same pattern 10, and the third alignment section 103 is cut from another pattern 10, i.e., the first alignment section 101, the second alignment section 102, and the third alignment section 103 having two cutting edges 12, respectively, are obtained by directly cutting the pattern 10.

In an embodiment, the first alignment section 101, the second alignment section 102, and the third alignment section 103 are all cut from the same pattern 10. After the first alignment section 101 and the second alignment section 102 are obtained by cutting, the remaining parts of the pattern 10 is corrected by OPC to cut the third alignment section 103. When the first alignment section 101, the second alignment section 102, and the third alignment section 103 are obtained by cutting one pattern 10, the first alignment section 101 and the second alignment section 102 may be obtained by cutting first. When cutting continues, the cut pattern 10 needs to be corrected by OPC to ensure that one corner is corrected by OPC, so that the third alignment section 103 obtained by cutting also includes only two cutting edges 12.

In an embodiment, the first alignment section 101, the second alignment section 102, and the third alignment section 103 are all cut from the same pattern 10. The remaining parts of the pattern 10 are cut to obtain a cut section after the first alignment section 101 and the second alignment section 102 are obtained by cutting. The cut section is corrected by OPC to obtain the third alignment section 103. When the first alignment section 101, the second alignment section 102, and the third alignment section 103 are obtained by cutting one pattern 10, the first alignment section 101 and the second alignment section 102 may be obtained by cutting first, and then the cutting continues to obtain a cut section having three cutting edges 12, and the corner thereof is corrected by OPC, thereby obtaining the third alignment section 103 including only two cutting edges 12.

It should be noted that for embodiments where the first alignment section 101, the second alignment section 102, and the third alignment section 103 are cut from one pattern 10, although in some cases a compensation pattern section may be added, the length of a specific semiconductor mark needs to be taken into account.

It should be noted that the semiconductor marks obtained in FIGS. 12-15 may be dicing marks.

According to the method for manufacturing semiconductor mark in the disclosure, a semiconductor mark having a peripheral edge corrected by OPC is obtained by cutting a pattern having a peripheral edge corrected by OPC and splicing the cut sections. That is, the semiconductor mark having the peripheral edge corrected by OPC may be formed after multiple alignment sections are spliced, thereby saving time for OPC after the semiconductor mark is formed, and improving the manufacturing efficiency of the semiconductor mark.

An embodiment of the disclosure further provides a semiconductor mark obtained according to the above method for manufacturing semiconductor mark.

The semiconductor mark in the present embodiment may be obtained according to the above method for manufacturing semiconductor mark according to size requirements.

After considering the specification and implementing the disclosure disclosed here, other implementations of the disclosure would readily be conceivable to a person skilled in the art. The disclosure is intended to cover any variations, uses, or adaptations of the disclosure following the general principles thereof and including such departures from the disclosure as come within known or customary practice in the art. It is intended that the specification and example implementations be considered as exemplary only, with a true scope and spirit of the disclosure being indicated by the foregoing claims.

It should be understood that the disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A method for manufacturing semiconductor mark, comprising:
   providing a pattern having a peripheral edge corrected by Optical Proximity Correction (OPC);
   cutting a plurality of independent alignment sections from the pattern; and
   splicing the plurality of alignment sections to form a semiconductor mark having a peripheral edge corrected by OPC;
   wherein the plurality of alignment sections each comprises an original edge corrected by OPC and a cutting edge not corrected by OPC, wherein the cutting edges of the plurality of alignment sections are spliced to form the semiconductor mark; and
   wherein an area of the semiconductor mark is smaller than that of the pattern.

2. The method for manufacturing semiconductor mark of claim 1, wherein the plurality of alignment sections comprise:
   a first alignment section comprising one cutting edge; and
   a second alignment section comprising one cutting edge, the first alignment section and the second alignment section being butted to form a first semiconductor mark,
   wherein the first alignment section and the second alignment section are obtained by cutting two opposite sides of the pattern.

3. The method for manufacturing semiconductor mark of claim 2, wherein after forming the first semiconductor mark, the method for manufacturing semiconductor mark further comprises:
   sequentially cutting the first semiconductor mark into a first section, a second section, and a third section; and
   butting the first section and the third section to form a second semiconductor mark.

4. The method for manufacturing semiconductor mark of claim 2, wherein after forming the first semiconductor mark, the method for manufacturing semiconductor mark further comprises:
   cutting the first semiconductor mark into a first section and a second section;
   arranging the first section and the second section oppositely and spaced apart to form a first fill region; and
   filling a first compensation pattern section in the first fill region to form a third semiconductor mark,
   wherein the first compensation pattern section is corrected by OPC before filling or the first compensation pattern section is corrected by OPC after filling.

5. The method for manufacturing semiconductor mark of claim 1, wherein the plurality of independent alignment sections comprise:
   a first alignment section comprising two cutting edges;
   a second alignment section comprising two cutting edges;
   a third alignment section comprising two cutting edges; and
   a fourth alignment section comprising two cutting edges,
   wherein the method further comprises:
   butting the first alignment section, the second alignment section, the third alignment section, and the fourth alignment section to form a fifth semiconductor mark; and
   the first alignment section, the second alignment section, the third alignment section, and the fourth alignment section being obtained by cutting four corners of the pattern.

6. The method for manufacturing semiconductor mark of claim 1, wherein the plurality of independent alignment sections comprise:
   a first alignment section comprising two cutting edges;
   a second alignment section comprising two cutting edges;
   a third alignment section comprising two cutting edges; and
   a fourth alignment section comprising two cutting edges,
   wherein the method further comprises:
   butting the first alignment section, the second alignment section, the third alignment section, and the fourth alignment section to form a fifth semiconductor mark; and wherein
   the pattern is cut into four portions in two perpendicular directions, which are then secondarily cut to obtain the first alignment section, the second alignment section, the third alignment section, and the fourth alignment section, respectively.

7. The method for manufacturing semiconductor mark of claim 1, wherein the plurality of independent alignment sections comprise:
   an L-shaped first alignment section comprising two cutting edges;
   a straight second alignment section comprising two cutting edges; and
   a straight third alignment section comprising two cutting edges,
   wherein the method further comprises:
   butting the second alignment section and the first alignment section while butting the third alignment section and the first alignment section to form a seventh semiconductor mark; and wherein
   a length of the second alignment section is equal to that of one cutting edge of the first alignment section, and a length of the third alignment section is equal to that of the other cutting edge of the first alignment section.

8. The method for manufacturing semiconductor mark of claim 7, wherein the first alignment section and the second alignment section are cut from the same pattern, and the third alignment section is cut from another pattern.

9. The method for manufacturing semiconductor mark of claim 7, wherein the first alignment section, the second alignment section, and the third alignment section are all cut from the same pattern, and remaining parts of the pattern are corrected by OPC to obtain the third alignment section by cutting after the first alignment section and the second alignment section are obtained by cutting.

10. The method for manufacturing semiconductor mark of claim 7, wherein the first alignment section, the second alignment section, and the third alignment section are all cut from the same pattern, remaining parts of the pattern are cut to obtain a cut section after the first alignment section and the second alignment section are obtained by cutting, and the cut section is corrected by OPC to obtain the third alignment section.

11. The method for manufacturing semiconductor mark of claim 1, wherein the plurality of independent alignment sections comprise:
an L-shaped first alignment section comprising two cutting edges;
a straight second alignment section comprising two cutting edges; and
a straight third alignment section comprising two cutting edges,
wherein the method further comprises:
butting the second alignment section and the first alignment section while butting the third alignment section and the first alignment section to form a seventh semiconductor mark; and wherein
a length of the second alignment section is equal to that of one cutting edge of the first alignment section, and a length of the third alignment section is equal to a length of the other cutting edge of the first alignment section minus a width of the second alignment section.

12. A semiconductor mark implemented according to the method for manufacturing semiconductor mark of claim 1.

13. The semiconductor mark of claim 12, comprising:
a first alignment section comprising one cutting edge; and
a second alignment section comprising one cutting edge, the first alignment section and the second alignment section being butted,
wherein the first alignment section and the second alignment section are obtained by cutting two opposite sides of the pattern.

14. The semiconductor mark of claim 13, further comprising:
a fill region provided between the first alignment section and the second alignment section; and
a compensation pattern section filled in the fill region, wherein the compensation pattern section is corrected by OPC before filling, or the compensation pattern section is corrected by OPC after filling.

15. The semiconductor mark of claim 12, comprising:
a first alignment section comprising two cutting edges;
a second alignment section comprising two cutting edges;
a third alignment section comprising two cutting edges; and
a fourth alignment section comprising two cutting edges,
the first alignment section, the second alignment section, the third alignment section, and the fourth alignment section being butted; and
the first alignment section, the second alignment section, the third alignment section, and the fourth alignment section being obtained by cutting four corners of the pattern.

16. The semiconductor mark of claim 15, further comprising:
a fill region provided between the first alignment section, the second alignment section, the third alignment section, and the fourth alignment section; and
a compensation pattern section filled in the fill region, wherein the compensation pattern section is corrected by OPC before filling, or the compensation pattern section is corrected by OPC after filling.

17. The semiconductor mark of claim 12, comprising:
an L-shaped first alignment section comprising two cutting edges;
a straight second alignment section comprising two cutting edges; and
a straight third alignment section comprising two cutting edges,
the second alignment section and the first alignment section being butted while the third alignment section and the first alignment section being butted;
wherein a length of the second alignment section is equal to that of one cutting edge of the first alignment section, and a length of the third alignment section is equal to that of the other cutting edge of the first alignment section.

18. A method for manufacturing semiconductor mark, comprising:
providing a pattern having a peripheral edge corrected by Optical Proximity Correction (OPC);
cutting a plurality of independent alignment sections from the pattern; and
splicing the plurality of alignment sections to form a semiconductor mark having a peripheral edge corrected by OPC;
wherein the plurality of alignment sections each comprises an original edge corrected by OPC and a cutting edge not corrected by OPC, and
wherein the cutting edges of the plurality of alignment sections are spliced to form the semiconductor mark;
wherein an area of the semiconductor mark is larger than that of the pattern.

19. The method for manufacturing semiconductor mark of claim 18, wherein the plurality of independent alignment sections comprise:
a first alignment section comprising one cutting edge; and
a second alignment section comprising one cutting edge, wherein the method further comprises:
arranging the first alignment section and the second alignment section oppositely and spaced apart to form a second fill region; and
filling a second compensation pattern section in the second fill region to form a fourth semiconductor mark; and wherein
the pattern is cut from middle to obtain the first alignment section and the second alignment section, the second compensation pattern section is corrected by OPC before filling, or the second compensation pattern section is corrected by OPC after filling.

20. The method for manufacturing semiconductor mark of claim 18, wherein the plurality of independent alignment sections comprise:
a first alignment section comprising two cutting edges;
a second alignment section comprising two cutting edges;
a third alignment section comprising two cutting edges; and
a fourth alignment section comprising two cutting edges, wherein the method further comprises:
arranging the first alignment section, the second alignment section, the third alignment section, and the fourth alignment section oppositely and spaced apart to form a third fill region;
filling a third compensation pattern section in the third fill region to form a sixth semiconductor mark; and wherein
the pattern is cut in two perpendicular directions to obtain the first alignment section, the second alignment section, the third alignment section, and the fourth alignment section, the third compensation pattern section is corrected by OPC before filling, or the third compensation pattern section is corrected by OPC after filling.

* * * * *